(12) United States Patent
Pickett et al.

(10) Patent No.: US 8,586,959 B2
(45) Date of Patent: Nov. 19, 2013

(54) MEMRISTIVE SWITCH DEVICE

(75) Inventors: Matthew D. Pickett, San Francisco, CA (US); Jianhua Yang, Palo Alto, CA (US); Dmitri Strukov, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 230 days.

(21) Appl. No.: 12/769,557

(22) Filed: Apr. 28, 2010

(65) Prior Publication Data

US 2011/0266515 A1 Nov. 3, 2011

(51) Int. Cl.
*H01L 47/00* (2006.01)

(52) U.S. Cl.
USPC .............. 257/4; 257/5; 257/E29.002

(58) Field of Classification Search
USPC .......... 257/4, 5, 154, E45.002, E27.004, 257/E21.003, E29.002, 1, 2, 3; 438/382, 438/369
See application file for complete search history.

(56) References Cited

U.S. PATENT DOCUMENTS

| | | | |
|---|---|---|---|
| 5,541,422 A * | 7/1996 | Wolf et al. | 257/9 |
| 6,834,008 B2 * | 12/2004 | Rinerson et al. | 365/158 |
| 6,967,350 B2 * | 11/2005 | Frick et al. | 257/50 |
| 7,884,349 B2 * | 2/2011 | Rinerson et al. | 257/5 |
| 8,072,795 B1 * | 12/2011 | Wang et al. | 365/148 |
| 8,199,556 B2 * | 6/2012 | Srinivasan et al. | 365/148 |
| 8,416,609 B2 * | 4/2013 | Meade | 365/149 |
| 8,431,458 B2 * | 4/2013 | Sills et al. | 438/277 |
| 8,437,174 B2 * | 5/2013 | Meade et al. | 365/149 |
| 2006/0245235 A1 * | 11/2006 | Krieger et al. | 365/115 |
| 2007/0117256 A1 * | 5/2007 | Stewart et al. | 438/99 |
| 2009/0016094 A1 | 1/2009 | Rinerson et al. | |
| 2009/0027976 A1 * | 1/2009 | Brewer et al. | 365/189.14 |
| 2009/0052225 A1 * | 2/2009 | Morimoto | 365/148 |

OTHER PUBLICATIONS

Dmitri B. Strukov, et al., "Four-dimensional address topology for circuits with stacked multilayer crossbar arrays", Proc Natl Acad Sci US A. Dec. 1, 2009, published online Nov. 16, 2009.

* cited by examiner

*Primary Examiner* — Cuong Q Nguyen
*Assistant Examiner* — Yosef Gebreyesus

(57) ABSTRACT

A memristive switch device can comprise a switch formed between a first electrode and a second electrode, where the switch includes a memristive layer and a select layer directly adjacent the memristive layer. The select layer blocks current to the memristive layer over a symmetric bipolar range of subthreshold voltages applied between the first and second electrodes.

20 Claims, 4 Drawing Sheets

MEMRISTIVE SWITCH DEVICE

STATEMENT OF GOVERNMENT INTEREST

This invention has been made with United States government support. The United States government has certain rights in the invention.

BACKGROUND

Nanometer-scale crossed-wire switching devices have been used to construct crossbar circuits and provide a route for the creation of ultra-high density non-volatile memory and non-volatile device based electronics. A series connection of crossed-wire switches has been used to construct a latch, which is a useful component of logic circuits and for communication between logic and memory. New logic families constructed from crossbar arrays of switches have the potential to dramatically increase the computing efficiency of CMOS circuits. The breadth of applications of such devices can be further enhanced by approaches that adjust the performance characteristics of the devices.

DETAILED DESCRIPTION OF EXAMPLE EMBODIMENTS

Figure 1A:
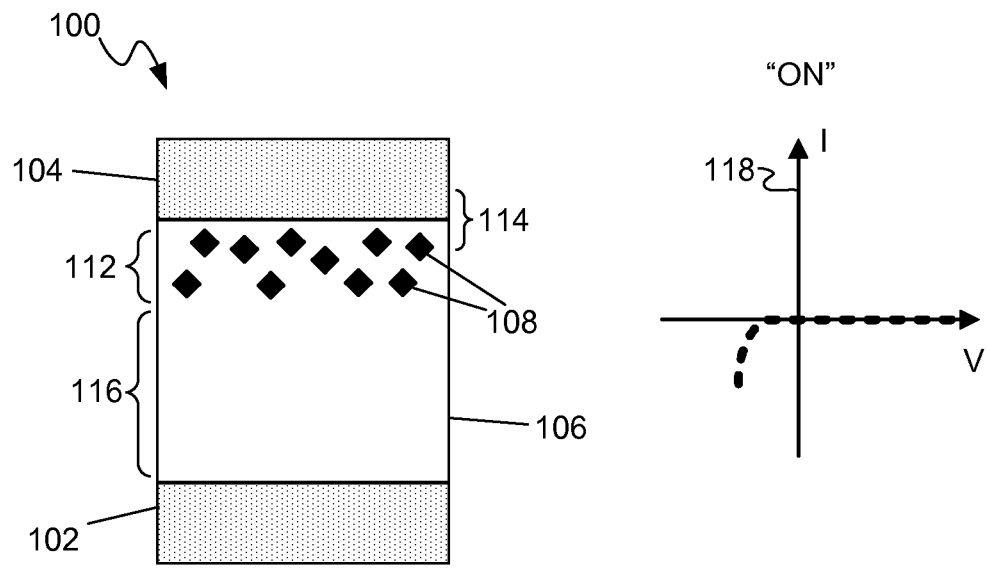
FIGS. 1A and 1B are cross-sectional diagrams of two operational states of an illustrative memristive switch element.

Reference will now be made to the exemplary embodiments illustrated, and specific language will be used herein to describe the same. Features and advantages of the technology will be apparent from the detailed description which follows, taken in conjunction with the accompanying drawings, which together illustrate, by way of example, particular principles and features of the technology. For the sake of brevity, reference numerals having a previously described function may or may not be described in connection with subsequent drawings in which they appear.

As used herein, the term "substantially" refers to the complete or nearly complete extent or degree of an action, characteristic, property, state, structure, item, or result. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an, state, structure, item, or result.

As used herein, "electrodes" and "wires" both refer to conductive elements in direct electrical communication with a junction or switch. More particularly the direct electrical communication is provided by direct physical contact. The terms may be used interchangeably, particularly in the context of crossbars where the wires forming the crossbar array also act as the electrodes of the individual switches in the array.

As used herein the term "symmetrical" in reference to a mathematical relationship or function refers to a feature of the function being expressed similarly on both sides of some reference point (e.g. $x=0$, or $y=0$, or other such origin). "Symmetrical" includes cases in which expression of the feature is substantially similar on both sides, as well as cases in which expression is identical.

As used herein the term "parallel" refers to an arrangement of two bodies or surfaces thereof in which the bodies or surfaces extend in the same direction, and where corresponding points on the bodies or surfaces are substantially equidistant.

As used herein, the term "nonlinear" refers generally to a characteristic of a function with the characteristic comprising deviation over a finite domain from the slope of a straight line that most closely approximates the function over that domain. With particular reference to current-voltage (I-V) functions, "nonlinear" functions exhibit marked departures from an ohmic function. An exponential I-V function is a particular example of such a function. More specifically, a highly nonlinear I-V function can exhibit substantially adjacent domains of very high resistance and very low resistance.

As used herein, the term "subthreshold" refers to a level that alone is insufficient to bring about an occurrence. More particularly, in reference to voltages used in writing data or otherwise bringing about a state change in a memristive switch, a subthreshold voltage is insufficient to substantially accomplish a state change in the switch. It should be noted however, that the phenomena underlying memristive state changes can be graded in nature. Therefore a subthreshold voltage may induce some effect in the switch state that, while not negligible, does not meet a criterion of full state change.

As used herein "adjacent" refers to a state of two structures where there is an absence of any structure between them. This can involve direct contact between the two structures. As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on the presentation of both members in a common group without indications to the contrary.

It is noted that discussion of methods and systems herein can be interchangeable with respect to specific embodiments. In other words, specific discussion of a method herein is equally applicable to embodiments as they relate to the system, and vice versa.

The present disclosure describes memristive junction switches and devices based thereupon. The term "memristive" when used to describe a material or a component made of such a material generally refers to the ability to stably occupy one or more conduction-based activation states. This ability can be imparted to an appropriate material by introducing one or more species of dopants, that can be induced to change distribution within the material.

Memristive switches in accordance with the embodiments discussed herein exhibit the capability of occupying at least two states: 1) a state of little to no conductance for electronic current, which can be referred to as an "OFF" state; and 2) a state of increased conductance for current, which can be referred to as an "ON" state. A particular characteristic of the memristive materials and switches is that either state can be induced by application of a sufficient switching voltage having an appropriate polarity to the switch. A further characteristic of such switches is that, once either state is induced, that state will persist indefinitely in the switch in the absence of such a voltage.

FIG. 1A illustrates an exemplary memristive switch device 100. A switch device may comprise a first electrode 102 and a second electrode 104, with a switch comprising a memristive layer 106 situated between them. Such a device can be made by depositing a metal or other appropriate material onto a substrate so as to form an electrode. The electrode may be patterned by conventional techniques including photolithography or electron beam lithography, or by more advanced techniques such as imprint lithography. The electrodes that are included in this device may be any suitable conductive material, including but not limited to gold, platinum, tungsten, copper, or metallic compounds, such as titanium nitride.

A memristive layer may then be deposited onto the first electrode. The memristive layer serves as the general region of the device in which switchable resistance characteristics are exhibited, and therefore comprises a memristive material that is suited to provide that function. In particular, the bulk of the memristive material can comprise a material that is electronically semiconducting or nominally electronically insulating. This includes materials known to be suitable as a dielectric in semiconductor devices. Non-limiting examples include oxides, sulfides, selenides, nitrides, phosphides, arsenides, chlorides, and bromides of silicon, transition metals, rare earth metals, or alkaline earth metals. In a particular example, the memristive material comprises a metal oxide. Non-limiting examples of such materials are oxides of titanium, tantalum, tungsten, niobium, magnesium, zirconium, and nickel. In a specific example, the memristive material can comprise titanium dioxide.

Suitable deposition techniques include conventional physical and chemical techniques, including evaporation from a Knudsen cell, electron beam from a crucible, sputtering from a target, electron beam evaporation, chemical vapor deposition (CVD), metal-organic chemical vapor deposition (MOCVD), molecular beam epitaxy, atomic layer deposition (ALD), or other forms of chemical vapor or beam growth from reactive precursors. The memristive region material may be deposited as a thin film from 1 to 100 nanometers thick.

The various conductance states in the switch can be determined by mobile dopants in the memristive material. These dopants can include charged vacancies, anions, or cations. In particular, the memristive region can further comprise a number of mobile dopants that can be induced to move through the memristive material by application of a sufficient switching voltage. The distribution of the dopants—and therefore the degree of doping of the memristive material—determines the conductance state of the switch. Mobile dopants can be added to the memristive material via any suitable technique, such as sputtering, electron beam evaporation, molecular beam epitaxy, CVD, MOCVD, ion implantation, thermal diffusion, or atomic layer deposition (ALD). Dopants may be introduced by depositing an initiator material that reacts with the memristive region material to create mobile dopants. In some embodiments these mobile dopants can be vacancies. For example, oxygen vacancies can be created by initiator/memristive material reactions such as $TiO_{2-x}$ with $TiO_2$; $ZrO_{2-x}$ with $ZrO_2$, or $SrTiO_{3-x}$ with $SrTiO_3$. In another example, nitrogen vacancies can be created by reacting GaN with $GaN_{1-x}$. In other embodiments the mobile dopants may be ions, such as sulfide ions produced by a GaN:S initiator layer on an memristive region including GaN.

As can be seen in the illustrative embodiment shown in FIG. 1A, memristive switches can be programmed to occupy different readable states by application of bias voltage of appropriate strength and polarity. The memristive layer 106 can include one or more species of dopants 108 that can be induced to change their distribution within the material. For example, the memristive material may be a titanium dioxide ($TiO_2$) matrix and the dopants 108 may be oxygen vacancies in that matrix, in which case the oxygen vacancies serve as positive charge carriers. By applying a negative switching voltage to the second electrode 104 relative to the first electrode 102, an electric field of sufficient intensity to move the dopants up toward the second electrode can be achieved. The upward drift of the dopants creates a doped region 112 at the interface 114 with the second electrode, and leaves an undoped region 116 within the rest of the matrix. It should be noted that "doped" and "undoped" as used herein as comparative terms, where a "doped region" is substantially more heavily doped than an "undoped region." It is not necessarily true, however, that an "undoped region" will be completely devoid of dopants. Rather, dopants are sufficiently scarce in an undoped region that the region has a substantially lower electronic conductance than a doped region.

As a result of the mobile dopants 108 being grouped at the electrode-matrix interface 114, the interface becomes essentially ohmic in nature due to the reduced conductance barrier. The interface is characterized by relatively high conductivity. This property is illustrated by the IN graph 118, without intending any limitation to particular values for voltage or current. The result is that the switch device 100 can conduct current when subjected to moderate voltages, e.g. lower than the write voltage. In this condition the switch can be said to be switched "ON."

Figure 1B:
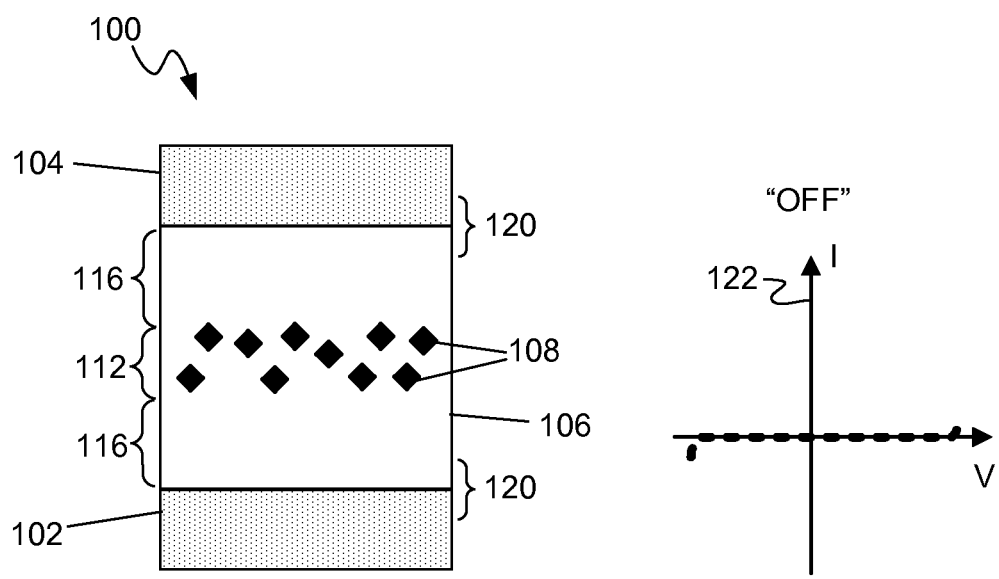

In a similar illustrative example shown in FIG. 1B, a sufficient switching voltage of opposite polarity (i.e. positive at the top electrode 104) can induce the vacancies to move away from the matrix electrode interface. This creates an undoped region 116 at each electrode interface 120, i.e. two Schottky-like interfaces of opposite bias direction. In this condition, little to no current can flow through the switch in either direction under moderate voltage, as illustrated in the IN graph 122. In this state the switch can be said to be "OFF."

As discussed above, a memristive switch can be programmed to assume different states (e.g. "ON" or "OFF") by application of a bias voltage of appropriate strength and polarity to the switch. Such application can be termed "writing" to the switch or a device based on such a switch. One feature of the switch is that the switch is bipolar so a "write" voltage can be applied by holding one electrode of the device at a voltage level while holding the other electrode at another voltage level, so that the result is that the total voltage across the device is above the write threshold. This mode of writing can be employed in particular in device architectures where one or both of the electrodes of a switch are shared in common with other switches or other components. Each electrode may then also be used to provide voltages to more than one component. As such, a memristive switch can be subjected to voltages from one or the other electrode that, while subthreshold for effective writing, may result in passage of a sufficient current through the switch so as to affect the state of the switch.

Reading the state of a memristive switch is one event that may involve such a subthreshold voltage. The state of a memristive switch can be read by applying a reading voltage to the electrodes of the switch. For example, a memristive switch as illustrated in FIGS. 1A and 1B can be read by applying a negative voltage to the second (upper) electrode relative to the first (lower) electrode. In a particular example, the first electrode and second electrode can each be held at respective voltages so that the memristive switch experiences a full reading voltage. In one aspect the reading voltage magnitude is sufficient that the resistive state of the switch can be ascertained by the absence, presence, or strength of current flow through the switch. In order to read the state without affecting it, a reading voltage magnitude can be chosen that is too low to induce movement of mobile dopants, but will induce current flow in an activated switch. However, an appropriate reading voltage will often be one sufficient to produce a current that is readable above any noise in the device or in the reading circuitry. Such considerations and others can place restrictions on the minimum reading voltages available.

Figure 2:
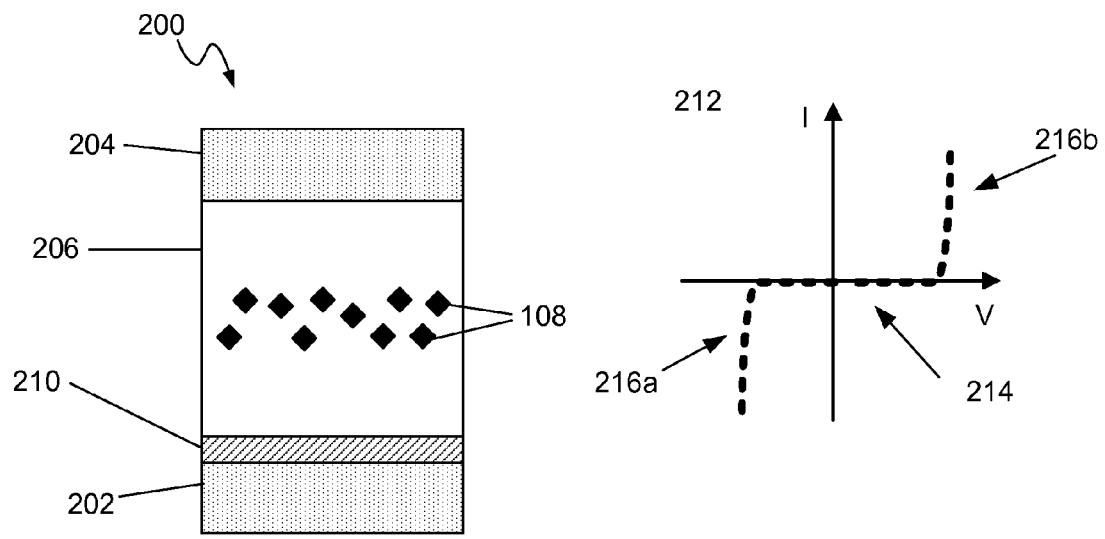
FIG. 2 is a cross-sectional diagram of a memristive switch device and illustrative I-V response in accordance with an embodiment described herein.

A switch in accordance with an embodiment can work so as to restrict state-specific events to bipolar application of appropriate voltages. Referring to FIG. 2, a switch 200 in accordance with the embodiment can comprise a first electrode 202 and a second electrode 204, with a memristive layer 206 situated between them and including dopants 108, each substantially as described in the above examples. The switch can further include a select layer 210 that blocks current to the memristive layer at lesser voltages. In particular, the select layer can be configured to block current to the memristive layer over a symmetric range of subthreshold voltages.

In a particular example, the select layer 210 exhibits a highly nonlinear current/voltage response over a symmetric range of voltages. In an aspect, a nonlinear response includes an exponential I-V function. In another aspect, the nonlinear response includes a power-law function in which the power is two or above.

In a specific example, such a nonlinear I-V response comprises a strongly resistive regime over a symmetric range of subthreshold voltages, so that the layer passes essentially no current at such voltages. One such I-V response is illustrated by the graph 212 in FIG. 2. The graph is not intended to limit particular voltage or current values or specific slope(s) that such a layer may exhibit in accordance with the principles discussed herein. The response includes a nonconductive regime 214 extending symmetrically in both negative and positive direction from zero volts. The response can further include a rapid transition to high conductivity as voltage magnitude increases outside the subthreshold range (e.g. highly conductive regimes 216a, 216b in graph 212). This nonlinear response can be present for both negative and positive voltages, and particularly can be substantially similar for both positive and negative voltages.

In another aspect, a select layer 210 can be situated directly adjacent the memristive layer 206. As such, fabrication of the switch 200 can comprise depositing a memristive layer on an electrode 202 and then depositing a select layer directly onto a memristive layer. Alternatively, these steps can be reversed, i.e. depositing a select layer on the electrode and then depositing the memristive layer directly on the select layer. Stated differently, either layer can be situated above the other layer in the switch in accordance with the principles herein. In a more specific aspect applicable to either embodiment, the select layer and memristive layer are in direct contact with each other, with no intervening layers or structures.

In a particular example, the select layer 210 comprises semiconductor material deposited so as to form a functional component in the switch. More particularly, the select layer can consist essentially of a single semiconductor component, rather than an assemblage of two or more components. In accordance with the principles herein, the semiconductor component can provide such a current/voltage response as described above. In particular, the component can exhibit a highly nonlinear response that is symmetric over a range of positive and negative voltages. More particularly, this property may reside in the single component such that no other components need be included in the select layer to provide this response. In accordance with this example, the semiconductor component of the select layer can be one of a tunnel diode, a Zener diode, a current controlled NDR transistor, or a trapping threshold device. In a particular aspect, the single semiconductor component is a single junction device. In a specific example of the switch device, the select layer consists essentially of a tunnel diode.

The select layer can be formed by deposition of a semiconductor material appropriate for the device intended to constitute the select layer. Semiconductor materials that can be used in the select layer include aluminum oxide, silicon oxide, hafnium oxide, manganese oxide, zinc oxide, aluminum nitride, silicon carbide, and combinations thereof. In a particular aspect, the select layer can be formed using wide band gap semiconductor materials. As used herein, the term "wide band gap" describes semiconductor materials having a band gap of over 3 electron volts. In a more particular aspect, amorphous wide band gap materials can be included in the select layer.

Suitable deposition techniques for the memristive layer and the select layer include conventional physical and chemical techniques, including evaporation from a Knudsen cell, electron beam from a crucible, sputtering from a target, electron beam evaporation, chemical vapor deposition (CVD), metal-organic chemical vapor deposition (MOCVD), molecular beam epitaxy, atomic layer deposition, or other forms of chemical vapor or beam growth from reactive precursors. In a particular aspect, the memristive layer and select layer can be deposited in successive steps using similar processes. More particularly, the deposition steps can be accomplished as part of one process conducted in a single deposition chamber.

Figure 3:
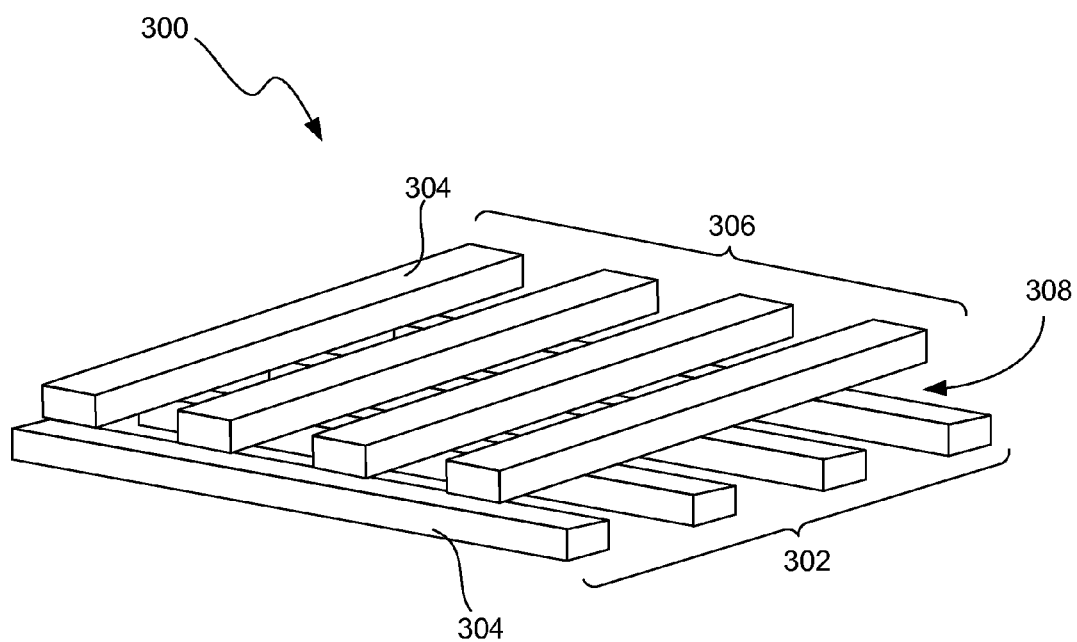
FIG. 3 is a perspective view of an illustrative nanowire crossbar architecture.

Memristive switches can be arranged in a crossbar array, in which two layers of superimposed wires are oriented so that individual wires of one layer cross wires of the other layer. An individual wire of one layer can be connected with an intersecting wire through a memristive switch situated at the junction of the two wires. One illustrative embodiment of such a crossbar array 300 is shown in FIG. 3. The crossbar array is composed of a bottom layer 302 of parallel wires 304 that are overlain by a top layer 306 of parallel wires 304. The top wires are oriented approximately perpendicular to the bottom wires, although the orientation angle can vary. Although individual nanowires in FIG. 3 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers 302, 306 may be fabricated using a variety of techniques including conventional photolithography as well as mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semiconductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

The two layers of nanowires form a lattice where a top wire overlies a plurality of bottom wires, and the wires comes into close contact at each junction. A memristive switch as described above can be situated at a junction and serve as the electrical contact between a pair of nanowires. In a more particular aspect, the intersecting wires can themselves serve as the electrodes.

In the array, each of the memristive junctions can be used to represent bits of data. For example, in the simplest case, the conductive ("ON") state of a junction can represent a binary "1" and the nonconductive ("OFF") state may represent a binary "0" or vice versa. Thus binary data can be written into the array by changing the conductive state of switch elements. The data can then be retrieved by sensing the state of the switch elements.

As discussed above, a state can be written to a particular memristive switch by application of a bias voltage of appropriate strength and polarity to the switch. As also discussed above, the state of a memristive switch can be read by applying a reading voltage to the electrodes of the junction, where the presence or absence of current, or difference in current strength, can thereby convey the state of the junction to reading circuitry. The same principle can operate in crossbar architecture. That is, reading or writing to a memristive junction switch can be accomplished by applying appropriate voltages to the switch via the wires connected by it.

One aspect of the crossbar array is that a given wire can makes junctions with a plurality of wires in the other layer. However, it is often desirable to select a particular switch junction on a wire for reading or writing without involving other junctions that include that wire. One approach for selecting junctions is to bias the wires of one layer at some fraction (e.g. approximately one-half) of the voltage needed for reading or writing. A particular junction can be selected by biasing the wire of the other layer that corresponds to that junction so that only the selected junction is subjected to the full voltage.

This approach can still suffer some shortcomings, however. For example, there may still be a need to use low read voltages, and the accuracy of crosspoint state reading can be limited. Another difficulty with selective interrogation of junctions in a crossbar is the issue of crosstalk between junctions. In an array of memristive switches where information is represented largely by conductive states, crosstalk between junctions can adversely affect data reading. That is, interrogation of one junction with a reading voltage may also result in a number of leakage currents traveling by other paths in the array. These leakage currents can act as a type of electrical "noise" in that they are spurious currents that may be detected by reading circuitry and therefore obscure the desired reading of the junction. These issues can be more significant as crossbar architecture size decreases and memristor packing density increases, and therefore impose limitations on fabrication of devices at nanoscale.

Figure 4A:
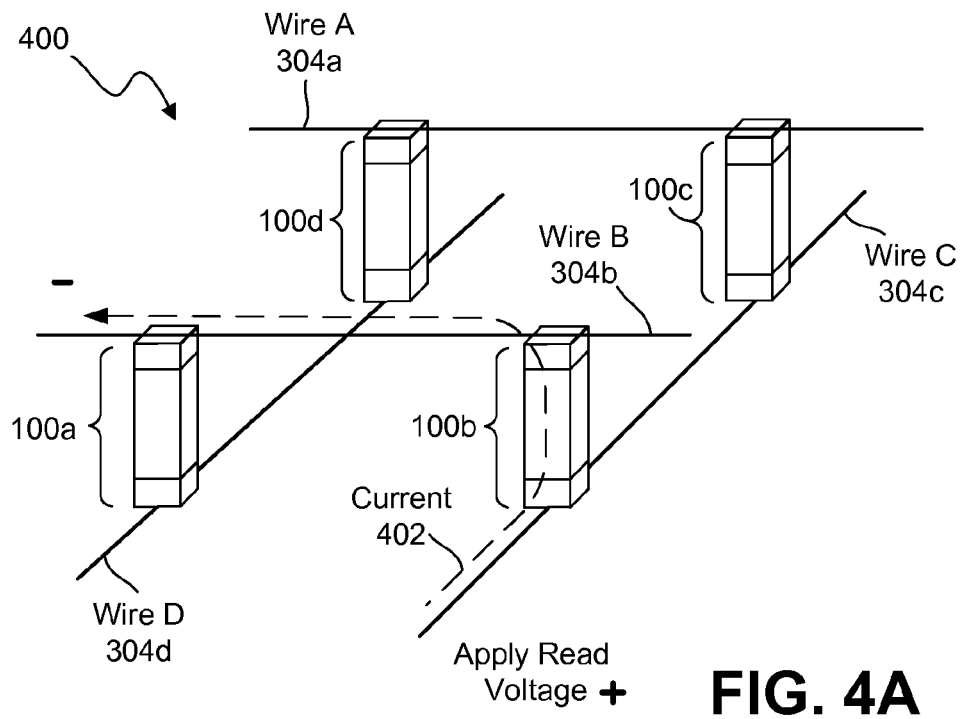
FIGS. 4A-4B are illustrative diagrams showing current paths through a portion of a crossbar memory array.
Figure 4B:
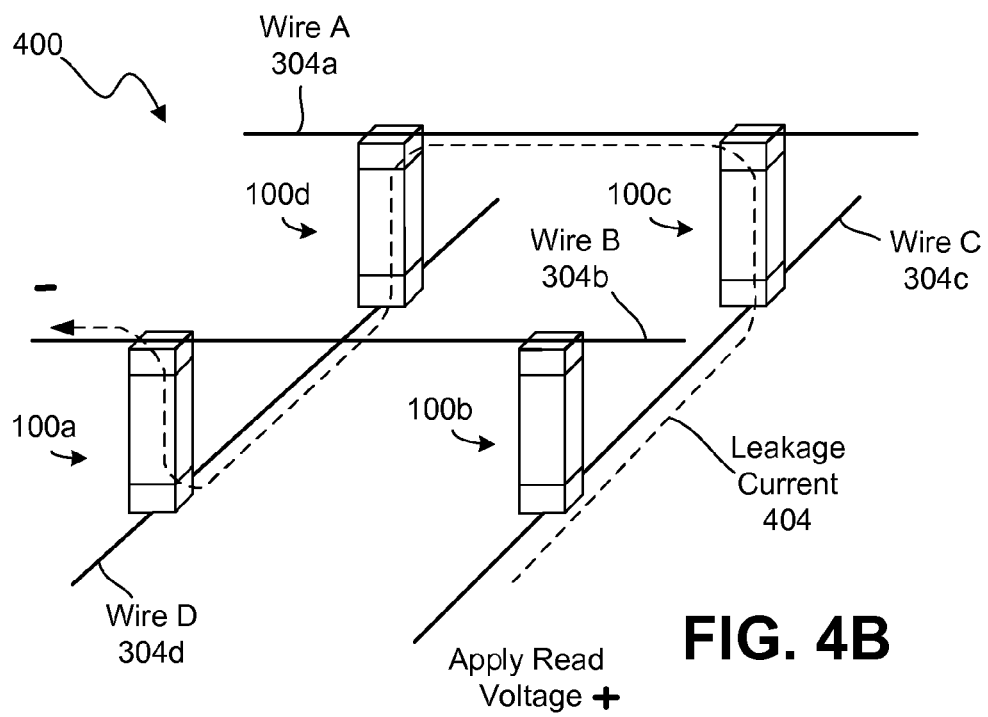

These issues are illustrated in FIGS. 4A and 4B, wherein similarly numbered elements correspond to the elements identified above with respect to FIGS. 1 and 3. A crossbar array 400 can comprise a layer of top wires overlaying a layer of bottom wires at a plurality of junctions, and a switch device 100a-d located at least one junction. For purposes of illustration, only a portion of the crossbar architecture 400 has been shown and the nanowires 304 have been shown as lines. Nanowires A and B are in an upper layer of nanowires and nanowires C and D are in a lower layer. Switches 100a-d connect the various nanowires at their junctions. According to this illustrative embodiment, the state of a junction between wire B and wire C can be read by applying a read voltage between wire B and wire C. In a more particular example, a fractional read voltage can be applied to each of wires B and C so that switch 100b experiences a suprathreshold read voltage. Ideally, if a current 402 flows through the junction when the read voltage is applied, the reading circuitry can ascertain that the junction is in its "ON" state. Conversely, if no current, or an insubstantial current, flows through the junction the reading circuitry can ascertain that the junction is in its "OFF" state. However, as shown in FIG. 4B, in this situation a leakage current 404 may travel along wire C and be conducted to the upper wire layer through adjacent "ON" switches. Such a current could be detected by the reading circuitry and result in a false state reading.

Figure 5:
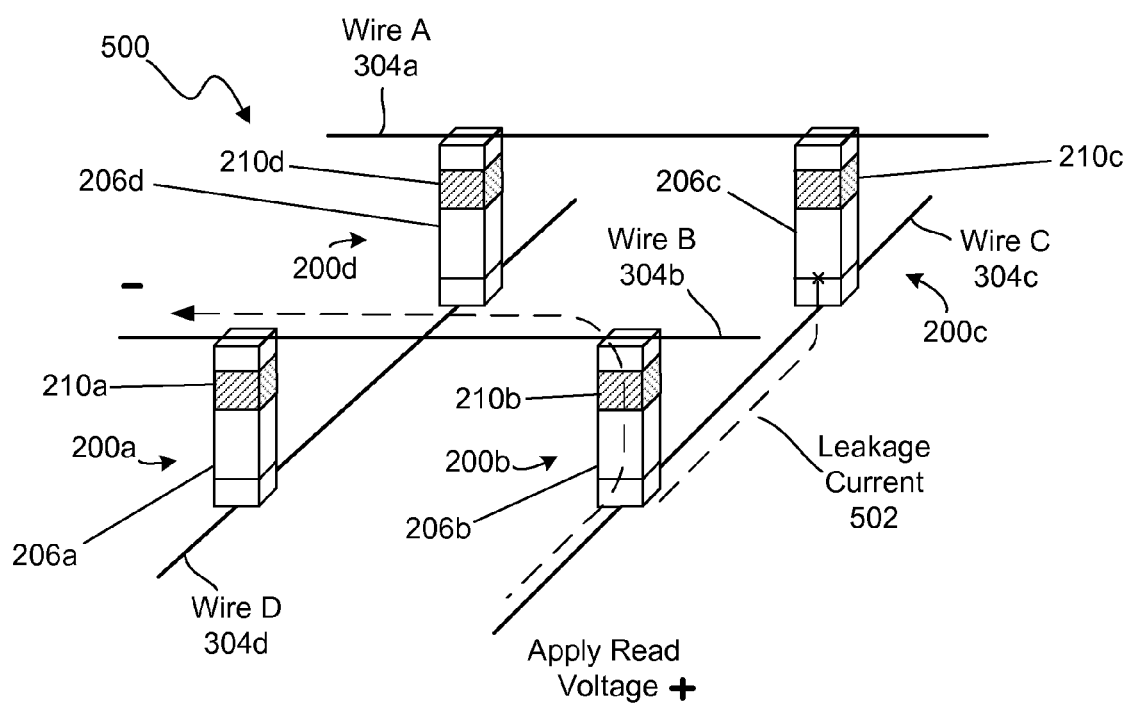
FIG. 5 is a diagram showing current paths through a portion of a crossbar array in accordance with an embodiment described herein.

This issue can be addressed in a crossbar array 500 as illustrated in FIG. 5, wherein similarly numbered elements correspond to the elements identified above with respect to FIGS. 2 and 3. In this crossbar array, switches 200a-d each include a select layer 210a-d in accordance with the principles herein. More particularly, the switch device 200a can comprise a memristive layer 206a-d as described above in contact with one wire at the junction and a select layer 210a-d situated directly between the memristive layer and the top wire at the junction. In particular, the select layer can exhibit a highly nonlinear current/voltage response over a symmetric range of voltages. In a more specific example, such a response can include being highly resistive over a symmetric range of subthreshold voltages, so that the layer passes essentially no current at such voltages. In a more particular example of the array, the select layer can consist essentially of a single semiconductor component. In accordance with this example, the semiconductor component of the select layer can be a tunnel diode, a Zener diode, a current controlled NDR transistor, or a trapping threshold device. In a particular aspect, the single semiconductor component is a single junction device. In a specific example of the array, the select layer may consist essentially of a tunnel diode.

A read operation in such a crossbar array 500 can proceed as follows. The state of a junction between wire B and wire C can be read by applying a read voltage between wire B and wire C, where the full read voltage lies in the conductive regime of the nonlinear I-V function of the select layer. However, none of the switches that neighbor switch 200b are connected to both wire B and wire C and therefore none experiences the full read voltage. As such, each of the adjacent switches resides in the nonconductive regime of its respective select layer. Leakage currents arising from the read operation are blocked by the nonconducting and the select layer blocks the passage of current through the switch.

Switches with select layers in accordance with the examples herein provide for selection of junctions for read or write operations in crossbar arrays with reduced incidence of leakage currents. This can provide increased accuracy in selection of junctions in crossbar devices. In addition, crossbar arrays in accordance with the examples can use power more efficiently, due to less power dissipated in leakage currents. One aspect of the switches is that the properties discussed herein are bipolar, and therefore effective for use of both positive and negative polarities in junction selection. Another aspect is that the select layer in accordance with the examples herein are integrated into the switch device, being directly between a memristive layer and an electrode. The select layer further can be coextensive with a memristive layer. As such, the select layer need not impact memristor switch packing density in crossbars or other devices.

While the forgoing examples are illustrative of the embodiments and underlying principles in one or more particular applications, it will be apparent to those of ordinary skill in the art that numerous modifications in form, usage and details of implementation can be made without the exercise of inventive faculty, and without departing from the principles and concepts discussed herein. Accordingly, no limitations are intended, except as by the claims set forth below.

The invention claimed is:

1. A memristive switch device comprising a switch formed between a first electrode and a second electrode, said switch comprising a memristive layer and a select layer directly adjacent the memristive layer, wherein the select layer is configured to block current to the memristive layer over a symmetric bipolar range of subthreshold voltages applied between the first and second electrodes.

2. The memristive switch device of claim 1, wherein the select layer consists essentially of a single semiconductor component.

3. The memristive switch device of claim 2, wherein the single semiconductor component is selected from the group consisting of a tunnel diode, a Zener diode, a current controlled NDR transistor, and a trapping threshold device.

4. The memristive switch device of claim 3, wherein the single semiconductor component is a tunnel diode.

5. The memristive switch device of claim 2, wherein the single semiconductor component is a single-junction component.

6. The memristive switch device of claim 1, wherein the select layer includes an amorphous wide band gap semiconductor material.

7. The memristive switch device of claim 1, wherein the select layer includes a material selected from the group consisting of aluminum oxide, silicon oxide, hafnium oxide, manganese oxide, zinc oxide, aluminum nitride and combinations thereof.

8. The memristive switch device of claim 1, wherein the memristive layer includes a semiconductor material selected from oxides of titanium, tantalum, tungsten, niobium, magnesium, zirconium, and nickel.

9. A switch array, comprising:
a layer of bottom wires, arranged substantially parallel to each other;
a layer of top wires arranged substantially perpendicular to the bottom wires and overlaying the bottom wires at a plurality of junctions, and
a memristive switch device located at a first of said junctions, said memristive switch device comprising:
a memristive layer in contact with the bottom wire at the first junction, said memristive layer comprising a mobile dopant; and
a select layer situated directly between the memristive layer and the top wire at the first junction and configured to block current to the memristive layer over a symmetric bipolar range of subthreshold voltages applied between the top wire and bottom wire.

10. The switch array of claim 9, wherein the select layer consists essentially of a single semiconductor component.

11. The switch array of claim 10, wherein the single semiconductor component is selected from the group consisting of a tunnel diode, a Zener diode, a current controlled NDR transistor, and a trapping threshold device.

12. The switch array of claim 11, wherein the single semiconductor component is a tunnel diode.

13. The switch array of claim 10, wherein the single semiconductor component is a single-junction component.

14. The switch array of claim 9, wherein the select layer includes a wide band gap amorphous semiconductor material.

15. A method of making a memristive switch device comprising a switch formed between a first electrode and a second electrode, said method comprising:
forming a memristive layer of said switch, said memristive layer comprising a mobile dopant; and
forming a select layer of said switch directly adjacent the memristive layer,
wherein forming the select layer comprising configuring the select layer to block current to the memristive layer over a symmetric bipolar range of subthreshold voltages applied between the first and second electrodes.

16. The method of claim 15, wherein the select layer consists essentially of a single semiconductor component.

17. The method of claim 16, wherein the single semiconductor component is selected from the group consisting of a tunnel diode, a Zener diode, a current controlled NDR transistor, and a trapping threshold device.

18. The method of claim 17, wherein the single semiconductor component is a tunnel diode.

19. The method of claim 16, wherein the single semiconductor component is a single-junction component.

20. The method of claim 15, comprising forming the select layer with a material selected from the group consisting of aluminum oxide, silicon oxide, hafnium oxide, manganese oxide, zinc oxide, aluminum nitride, and combinations thereof.

* * * * *